VOLTAGE-CONTROLLED OSCILLATOR
Filed Feb. 24, 1958
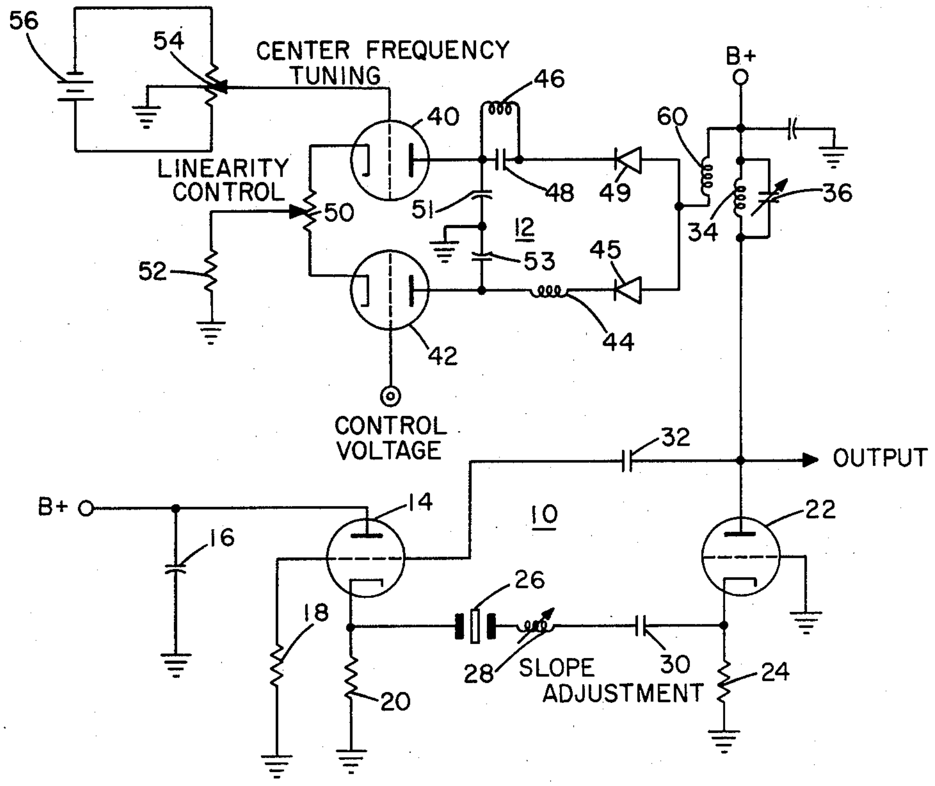
RICHARD P. MATHISON
DEAN W. SLAUGHTER
LEE W. RANDOLPH
*INVENTORS*
BY Lyon & Lyon
*ATTORNEYS*

2,945,191
Patented July 12, 1960

2,945,191

VOLTAGE-CONTROLLED OSCILLATOR

Richard P. Mathison, Altadena, Dean W. Slaughter, La Canada, and Lee W. Randolph, San Gabriel, Calif., assignors to California Institute Research Foundation, Pasadena, Calif., a corporation of California Filed Feb. 24, 1958, Ser. No. 717,170
6 Claims. (Cl. 332—16)

This invention relates to oscillators and more particularly to improvements in oscillators the frequency of which can be varied by varying a voltage applied thereto.

An object of this invention is the provision of a novel oscillator the frequency of which can be varied by variations of a control voltage.

Another object of the present invention is the provision of an oscillator the frequency of which is variable linearly with linear variation in the control voltage applied thereto.

Yet another object of the present invention is the provision of a novel voltage-controlled oscillator which is stable and readily reproducible.

Yet another object of the present invention is the provision of a novel and useful voltage-controlled oscillator the frequently of which is easy to adjust.

These and other objects of the invention are achieved by providing an oscillator consisting of a control stage and an oscillator stage. The oscillator stage includes two tubes, one of which is connected as a grounded plate amplifier and the other as a grounded grid amplifier. These two tubes are cathode-coupled by means of a series resonant crystal and a variable phase shift network. The oscillator control stage comprises a differential amplifier which controls the current in a variable reactance which is coupled to the output tank circuit of the oscillator which is in the plate circuit of the grounded grid amplifier.

The novel features that are considered characteristic of this invention are set forth with particularlity in the appended claims. The invention itself both as to its organization and method of operation, as well as additional objects and advantages thereof, will best be understood from the following description when read in connection with the accompanying drawing, which is a circuit diagram of the embodiment of the invention.

Referring now to the drawing, which is a circuit diagram of the invention, this includes an oscillator stage 10 and a control stage 12. The oscillator stage includes a first tube 14 which has its plate grounded for alternating current by reason of condenser 16 which is connected between its plate and ground. The grid of the tube 14 is connected to ground through a resistor 18. A cathode load resistor 20 is connected between the cathode of tube 14 and ground. A second tube 22 has its control grid connected directly to ground and also has a resistor 24 connected between its cathode and ground. The output of tube 14 is cathode-coupled to the tube 22 through a crystal 26 which is in series with a series-resonant tuned circuit including a variable inductance 28 in series with a capacitance 30 which is connected to the cathode of tube 22. The inductance 28 adjusts the slope of the response characteristic of the oscillator and, therefore, is known as the slope adjustment. Feedback for closing the oscillation loop is provided by means of a condenser 32 which is connected from the plate of tube 22 to the control grid of tube 14. It will be recognized from the above description that tube 14 is connected as a grounded plate amplifier and tube 22 is connected as a grounded grid amplifier.

A tank circuit consisting of an inductance 34 and a variable capacitor 36 connected in shunt therewith, is connected to the plate circuit of tube 22. By varying the reactance of the inductance 34 and the plate tank circuit, the frequency of oscillation of the oscillator stage may be varied. The reactance of inductance 34 is varied by the operation of the control stage 12.

The control stage 12 includes two tubes 40 and 42 which are connected in a balanced difference D.-C. amplifier circuit with opposite reactances in the plate current paths. One of these reactances comprises an inductance 44, the other reactance comprises a condenser 48 with an inductance 46 connected thereacross. The inductance is for the purpose of bypassing the condenser with direct current without short circuiting the alternating current voltage across the condenser. The value selected is such that this path has a principally capacitive reactance. The reactances 44, 48 are respectively connected in series with diodes 45, 49. These diodes act as current controlled variable resistances. The elements 44, 48 and 45, 49 form a parallel resonant circuit. The two tubes have their cathodes connected to the ends of the fixed resistor of a potentiometer 50 the slider of which is connected to a common cathode load resistance 52. The potentiometer 50 is employed for the purpose of adjusting the cathode current balance at zero-signal input to the two control grids of tubes 40, 42 and thereby the resistance balance of the diodes 45, 49.

The center tuning frequency for the voltage-controlled oscillator may be established by applying a voltage to the grid of tube 40. Exemplary of a means for obtaining this voltage is a potentiometer 54 which is center tapped and connected to ground at the center tap. The ends of the potentiometer resistor are connected across a bias battery 56. A control voltage applied to the control grid of tube 42 will cause the oscillator to change its frequency in response thereto above or below the center frequency established by the voltage applied to the grid of tube 40. Effectively this is determined by the magnitude and direction of the unbalance of direct currents through the two diodes in the plate circuits of tubes 40, 42 which is determined by the amplitude and polarity of the control voltage applied to the control grid of tube 42. Since the value of a diode resistance varies with the current this causes an unbalance in the diode resistances thereby unbalancing the reactive currents which flow through the two opposite reactances resulting in a change in phase of the sum of the two currents that flows in inductance 60 connected to both diodes. Capacitors 51, 53 respectively connect the plates of tubes 40, 42 to ground and serve to bypass any unwanted frequencies. The inductance 60 is inductively coupled to the inductance 34 and thus variations of the reactive current flowing through the inductance 60 can operate to change the reactance of the inductance 34 and thereby the frequency of oscillation of the oscillator stage 10. Output may be taken from the plate circuit of the tube 22.

A unique reactance control circuit is provided in this voltage-controlled oscillator. It provides an equal reactance change on both sides of the center tuned frequency position in response to equal control voltage changes about this position. Temperature and power supply variations are automatically compensated for by the two diodes, preferably, silicon rectifiers, since the resistance of these varies correspondingly to maintain the stability of the performance of the reactance modulator.

The inductance 28, as previously pointed out is in a series-tuned circuit and is adjusted to set in the desired slope of the control characteristic. Thereafter the plate tank circuit consisting of inductance 34 and variable capacitor 36 is tuned to the center of the operating frequency range by adjusting the capacitor 36. The potentiometer 54 is also adjusted to achieve this result so that with no control input voltage applied to the grid of tube 42 the oscillator will oscillate at a frequency established as the desired center frequency. As an illustration and not to serve as a limitation, in an embodiment of the invention which was constructed, the oscillator was tuned to a center frequency of 31.8955 megacycles and provided a linear control characteristic over a ±0.0094-percent frequency range with an adjustable control characteristic slope over a frequency range of 0.003 percent per volt to 0.03 percent per volt, and a zero-control-voltage frequency which was electronically tunable over a 0.01-percent range when the slope is adjusted to 0.006 percent per volt.

Accordingly, there has been shown and described herein a novel and useful voltage-controlled oscillator which responds linearly to changes in voltage, is stable, and readily tuned and adjusted and yet has a high sensitivity characteristic.

We claim:

1. A voltage-controlled oscillator comprising an oscillator having a tank circuit tuned to a desired frequency of oscillation, and means to vary the reactance of said tank circuit to vary the frequency of oscillation of said oscillator comprising a differential amplifier, reactance means for varying said tank circuit reactance in circuit with said differential amplifier, and means to apply a control voltage to said differential amplifier to vary the current drawn by said differential amplifier through said reactance means to vary said tank circuit reactance accordingly.

2. A voltage-controlled oscillator comprising an oscillator including a first and second tube having an anode, cathode and control grid, means including a crystal coupling said first and second tube cathode, a feedback capacitor coupling said second tube anode to said first tube control grid, a tank circuit connected to said second tube anode, and means to vary the frequency of said oscillator including a variable reactance inductively coupled to said oscillator tank circuit for varying its reactance, a differential amplifier connected to said variable reactance, and means for applying a control voltage to said differential amplifier for controlling the current drawn by said differential amplifier through said variable reactance.

3. A voltage-controlled oscillator including an oscilltor stage having a tank circuit tuned to a desired frequency of oscillation, and means to vary the reactances of said tank circuit to vary the frequency of oscillation including a first and a second tube each having anode, cathode and control grid, a load resistor, means coupling the cathode of each of said tubes to said load resistor, a first inductance connected in series with said first tube anode, a capacitance connected in series with said second tube anode, a second inductance inductively coupled to said tank circuit, first and second current controlled variable resistances respectively coupling said inductance and capacitance to said second inductance, and means for applying a control voltage to one of said first and second tube control grids to vary the tube current and thereby the reactance of said oscillator tank circuit.

4. A voltage-controlled oscillator comprising an oscillator stage including a grounded plate amplifier, a grounded grid amplifier, means coupling said grounded plate and grounded grid amplifier for oscillation including a crystal, and a variable inductance in series therewith, a tunable output tank circuit connected to said grounded grid amplifier, and means for varying the frequency of oscillation of said oscillator stage comprising a variable reactance coupled to said tunable output tank circuit to vary the reactance thereof, a differential amplifier, means coupling said differential amplifier to said variable reactance for varying its reactance, and means for applying a control voltage to said differential amplifier for controlling said variable reactance and thereby the frequency of oscillation of said oscillator stage.

5. A voltage-controlled oscillator comprising a control stage and an oscillator stage controlled thereby, said oscillator stage including a first and second tube each having an anode cathode and central means coupling the cathode of said first and second tubes including a crystal, and a series-resonant circuit, a feedback capacitor coupled between said second tube anode and said first tube control grid, a tank circuit connected to said second tube anode including an inductance and a capacitance connected in parallel said control stage including third and fourth tubes each having an anode cathode and a control grid, a load resistor, means connecting said third and fourth tube cathodes to said load resistor, a first inductance connected to said third tube anode, a capacitor connected to said fourth tube anode, a first and second current controlled variable resistance respectively connected in series with said first inductance and capacitor, a second inductance connected to both said variable current controlled resistances, and inductively coupled to said tank circuit inductance, means to apply a bias voltage to said fourth tube control grid to establish a desired center frequency of oscillation, and means to apply a variable control voltage to said third tube control grid to vary the frequency of oscillation about said center frequency responsive to said variable central voltage.

6. A reactance modulator comprising a first and second tube each having anode cathode and control grid, a load resistor means connecting said first and second tube cathodes to said load resistor, a first inductance connected to said first tube anode, a capacitance connected to said second tube anode, a separate rectifier connected to each said first inductance and capacitance, a second inductance connected to both said rectifiers, and means to apply voltages to said tube control grids to vary the reactance currents flowing through said second inductance.

References Cited in the file of this patent

UNITED STATES PATENTS

| | | |
|---|---|---|
| 2,454,954 | Usselman | Nov. 30, 1948 |
| 2,598,722 | Richards | June 3, 1952 |
| 2,614,227 | Bordewieck et al. | Oct. 14, 1952 |
| 2,830,176 | Howell et al. | Apr. 8, 1958 |